United States Patent [19]

Sasayama et al.

[11] Patent Number: 4,604,535
[45] Date of Patent: Aug. 5, 1986

[54] FET-BIPOLAR SWITCHING DEVICE AND CIRCUIT

[75] Inventors: Takao Sasayama, Hitachi; Kazuo Kato, Ibaraki; Masayoshi Naito, Katsuta, all of Japan

[73] Assignee: Hitachi, Ltd., Tokyo, Japan

[21] Appl. No.: 376,575

[22] Filed: May 10, 1982

[30] Foreign Application Priority Data

May 13, 1981 [JP] Japan .................................. 56-70803

[51] Int. Cl.[4] ..................... H03K 17/04; H03K 17/60; H03K 17/687
[52] U.S. Cl. .................................. 307/570; 307/270; 307/304; 307/544; 307/581; 357/43
[58] Field of Search ............... 307/544, 242, 570, 581, 307/264, 270, 304; 357/43

[56] References Cited

U.S. PATENT DOCUMENTS

| | | |
|---|---|---|
| 3,636,372 | 1/1972 | Hujita et al. .......................... 307/570 |
| 4,066,917 | 1/1978 | Compton et al. ................ 307/570 X |
| 4,286,175 | 8/1981 | Baker .................................. 307/581 |
| 4,303,841 | 12/1981 | Baker .................................. 307/570 |
| 4,356,416 | 10/1982 | Weischedel ......................... 307/570 |

Primary Examiner—Stanley D. Miller
Assistant Examiner—David R. Hudspeth
Attorney, Agent, or Firm—Antonelli, Terry & Wands

[57] ABSTRACT

A switching device and circuit comprises a bipolar transistor and at least two field effect transistors for controlling the bipolar transistor. A first field effect transistor has its drain and source connected across the collector-base of the bipolar transistor and a second field effect transistor has its drain and source connected across the base-emitter of the bipolar transistor. Gates of the first and second field effect transistors are connected in common and supplied with a voltage signal. The first field effect transistor is of an enhancement type and the second field effect transistor is of a depletion type.

8 Claims, 10 Drawing Figures

FET-BIPOLAR SWITCHING DEVICE AND CIRCUIT

This invention relates to an improved semiconductor switching device and circuit.

As well known in the art, semiconductor switching devices are indispensable elements for logic circuits and are used as elements for controlling currents to various electrical loads. Bipolar transistors, junction type field effect transistors (hereinafter simply referred to as JFET) and metal oxide semiconductor (hereinafter simply referred to as MOS) FETs are commonly used as such switching devices. These devices are incorporated into a circuit in consideration of their characteristics and used. Especially, a switching device as applied to, for example, a logic circuit is desired to be operated with low power and a short delay time. A switching device as applied to power switching is required to have, in addition to the above requirement, the ability to handle larger current and voltage with low power dissipation. The conventional switching device encounters the following problems in satisfying all of the requirement.

For providing a switching operation with a bipolar transistor, a signal current is applied to the base electrode and a change in collector current is derived as an output. The bipolar transistor is of an n-p-n or p-n-p structure. When the minority carrier injected from the emitter to the base layer diffuses the narrow base layer and flows into the reversely biased collector-emitter junction, the bipolar transistor is switched from cut-off state to turn-on state. After the transistor has been turned on, current due to carrier, namely, the minority carrier (hole in n-type and electron in p-type) and the majority carrier which recombines with the minority carrier for extinction thereof, flows through the base layer. Accordingly, a while high conductance state can advantageously be attained, the continuous supply of electric change to the base electrode is necessary to fill up loss of electric charge due to the recombination during the turn-on period. This means that the bipolar transistor is of a current input type which requires high power consumption. Specifically, a bipolar transistor used for power switching suffers from an increased reactive power. In view of the above operational principle, the bipolar transistor faces a problem in increasing switching speed. When the supply of base current ceases to thereby cut off the transistor, it takes an appreciable time for the injected electric change which has been supplied previously to recombine for extinction, resulting in turn-off delay time of the device. This delay time depends on the amount of current drawn into the base during the turn-on period. More particularly, even if an amount of base current which is in excess of the amount necessary for the recombination and extinction of the minority carrier in the base is passed to increase the amount of electric charge, the carrier within the base has already been saturated and conductance will not increase, thus exhibiting a saturated state. Therefore, it is necessary to remove the supplied excess carrier during the turn-off period with the result that the switching speed is greatly degraded.

To obviate the defects of the bipolar transistor, various proposals have been made. Specifically, the so-called Darlington bipolar transistor in which two stages of bipolar transistors are connected are well known as a solution to the above problems, especially, in power switching. Since in the Darlington bipolar transistor the collector-base of one transistor in the output stage is connected with the collector-emitter of the other transistor with their collectors connected in common, the current amplification of the Darlington bipolar transistor can be a product of the current amplifications of the respective transistors and can be increased drastically. Therefore, the Darlington bipolar transistor is particularly effective for power switching under large current conduction. The above construction of the Darlington bipolar transistor is also effective to increase the switching speed because the collector-base of the output stage transistor is short-circuited by the transistor of the preceding stage and is then turned on, thus preventing the occurrence of forward bias of the base-collector junction which is due to saturation of the base layer by injected carrier, so that excess carrier to be extinguished during the turn-off period will not be generated, which makes it possible to raise the turn-off speed. However, it sometimes happens that the input transistor is saturated to disadvantageously reduce the input impedance.

To prevent the bipolar transistor from being saturated, another method has been proposed in which a metal-semiconductor (Schottky) diode is connected across the base and the collector with its forward direction being identical with the rectifying polarity of the bipolar transistor. Since the metal-semiconductor diode has a forward voltage drop which is far smaller than that across the base-collector, the base-collector junction is forwardly biased very slightly. This reduces storage of the excess carrier and assures a high speed switching operation. The problem of the low input impedance, however, still remains unsolved.

The MOS FET on the other hand has a high input impedance and is a majority carrier device. Therefore, in the MOS FET, there occurs no injection of minority carrier and the time for the recombination and extinction as in the bipolar transistor is not required. However, only majority carrier is existent in the conduction channel and hence, conductance per unit crosssectional area of the MOS FET is smaller than that of the bipolar transistor. Accordingly, a large-sized MOS FET is necessary for power switching under large current and its input capacitance at the gate becomes large. For these reasons, a large amount of energy is required to charge or discharge the input capacitance and the input impedance is decreased during high speed operations.

It is therefore an object of this invention to provide a high-speed, high-load drive switching device having a high input impedance comprised of an input capacitance and a high switching conductance and being capable of reducing delay in switching-off due to emitter-base storage charge inherent in bipolar transistors.

To accomplish the above object, a switching device according to the present invention comprises depletion type FETs (DFETs) such as a MOS FET and a JFET and a bipolar transistor. A source of the MOS FET is connected to a drain of the JFET and a base of the bipolar transistor is connected to the connecting junction. A drain of the MOS FET is connected to a collector of the bipolar transistor and a source of the JFET is connected to an emitter of the bipolar transistor. Conduction or non-conduction of the bipolar transistor is controlled by a common input electrode of gates of the MOS FET and the JFET.

The features of the present invention will be well understood from the following description of the embodiments of the invention in conjunction with the accompanying drawings in which.

The invention will now be described by way of example with reference to the drawings.

Figure 1:
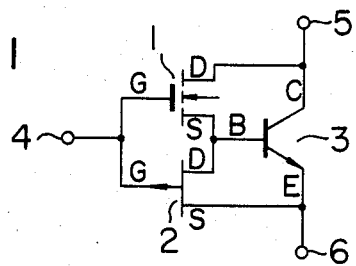
FIG. 1 is a schematic diagram showing one embodiment of a switching device according to the invention.

As schematically shown in FIG. 1, a switching device embodying the present invention comprises a MOS FET 1 of, for example, n-channel type, a junction type FET 2 of, for example, p-channel type, and a bipolar transistor 3 of, for example, npn-type. A source S of the MOS FET is connected to a source S of the junction type FET 2, with the connecting junction connected to a base B of the bipolar transistor 3. Gates G of the MOS FET 1 and the junction type FET 2 are connected in common. A drain D of the MOS FET 1 is connected to a collector C of the bipolar transistor 3 and a drain D of the junction type FET 2 is connected to an emitter E of the bipolar transistor 3.

The common connecting junction of the gates G of the MOS FET 1 and junction type FET 2 is coupled to a gate electrode 4, the collector C of the bipolar transistor 3 to a drain electrode 5, and the emitter E of the bipolar transistor 3 to a source electrode 6.

Figure 2:
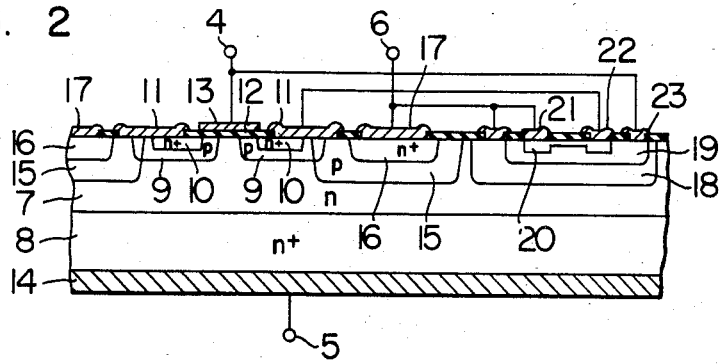
FIG. 2 is a sectional view showing a structure in which the switching deivce of FIG. 1 is formed in a single chip.

The switching device of the above construction is formed in, for example, a single semiconductor chip as shown in FIG. 2. More particularly, a rear surface portion of an $n^-$-type semiconductor substrate 7 is diffused (doped) with an $n^+$-type impurity to form an $n^+$-type semiconductor layer 8. Formed in a major surface portion of the $n^-$-type semiconductor substrate 7 is an annular p-type diffusion layer 9 in which an $n^+$-type diffusion layer 10 is formed which is concentrical with the layer 9. The surface of the $n^+$-type diffusion layer 10 is partly covered with an electrode 11 and the remaining portion is covered with an insulating film in the form of a silicon oxide film 12. Formed on the silicon oxide film 12 is an electrode 13 which is in register with a portion of the p-type diffusion layer 9 surrounded by the $n^+$-type diffusion layer 10.

This structure completes a MOS FET 1 having the electrode 11 as source electrode, the electrode 13 as gate electrode, and an electrode 14 formed on the rear surface of the $n^+$-type semiconductor layer as drain electrode.

Also formed in the major surface portion of the $n^-$-type semiconductor substrate 7 is a p-type diffusion layer 15 which surrounds the p-type diffusion layer 9, making contact thereto. Formed in the p-type diffusion layer 15 is an $n^+$-type diffusion layer 16 which is concentrical with the layer 15. The surface of the $n^+$-type diffusion layer 16 is partly covered with an electrode 17 and the electrode 11 extends to part of the surface of the p-type diffusion layer 9, with the silicon oxide film 12 formed at a region excepting the electrodes 17 and 11.

This structure completes a bipolar transistor 3 having the electrode 17 as emitter electrode, the electrode 11 as base electrode and the electrode 14 as collector electrode.

Also formed in the major surface portion of the $n^-$-type semiconductor substrate 7 is a p-type diffusion layer 18 which is spaced apart from the p-type diffusion layer 15 and in which an n-type diffusion layer 19 is formed. Formed in the n-type diffusion layer 19 is a p-type diffusion layer 20. Opposite ends of the p-type diffusion layer 20 are partly covered with electrodes 21 and 22, and the n-type diffusion layer 19 is partly covered with an electrode 23. The silicon oxide film 12 is formed at a region excepting the electrodes 21 to 23.

This structure completes, within an isolation layer in the form of the p-type diffusion layer 18, a junction type FET 2 having the electrode 21 as drain electrode, the electrode 22 as source electrode and the electrode 23 as gate electrode.

The switching device comprised of a plurality of component devices constructed as above is applied, at its chip surface, with a wiring connection by, for example, vapor deposition as shown in FIG. 2 in consideration of connections common to the respective diffusion layers.

In operation, when voltage is not applied to the gate electrode 4, voltage at the gate electrode 13 is zero in the MOS FET 1 constituted by the $n^+$-type diffusion layer 10, p-type diffusion layer 9 and $n^+$-type semiconductor substrate 8 together with the gate electrode 13 formed on the silicon oxide film 12, so that no channel is set up on the surface of the p-type diffusion layer 9 and the MOS FET is rendered off. In the junction type FET 1 constituted by the n-type diffusion layer 19 and p-type diffusion layer 20 together with the electrodes 21, 22 and 23, on the other hand, the p-type diffusion layer 20 short-circuits the electrodes 21 and 22 in the absence of voltage applied to the gate electrode 23 and consequently, the junction type FET is rendered on. Accordingly, voltage applied across the electrodes 5 and 6 is blocked by the $n^-$-type semiconductor substrate 7 and p-type diffusion layers 15, 9 and 18 to turn off the switching device.

When voltage is applied to the gate electrode 4, consequently, to the gate electrode 13 of the MOS FET, this voltage sets up a channel on the surface of the p-type diffusion layer via the silicon oxide film 12, thereby establishing a current path through gate electrode 4, $n^+$-type diffusion layer 16, $n^-$-type diffusion layer 15, a channel formed in the p-type diffusion layer 19, $n^+$-type diffusion layer 10, electrodes 11 and 22, p-type diffusion layer 15, $n^+$-type diffusion layer 16, and source electrode 6. As a result, the MOS FET 1 and the bipolar 3 transistor are both turned on. Under the application of positive voltage to the n-type diffusion layer 19 of the junction type FET, a path between the base and emitter of the bipolar transistor which had been short-circuited by the p-type diffusion layer 9 can be brought into the so-called pinch off because the n-type diffusion layer 19 and the p-type diffusion layer 20 are reversely biased therebetween, and a depletion layer which develops at the boundary and the p-type diffusion layer 20 in the form of a shallow layer near the surface merges into a depletion layer region. Accordingly, the junction type FET on this path is rendered off and under this condition, the collector-base of the bipolar transistor is short-circuited by the drain-source on-resistance of the MOS FET to ensure that the entire on-resistance can be made smaller than that of the so-called Darlington connection having a preceding stage bipolar transistor. To detail, in contrast to the Darlington connection in which none of the transistors can be saturated, that is to say, the base-collector and the base-emitter cannot be biased forwardly at the same time, the MOS FET of the switching device embodying the invention can exhibit a resistance characteristic.

Since the junction type FET is effective to short-circuit and extinguish electric charge stored in the base-emitter (p-type diffusion layer 15/n+-type diffusion layer 16) of the bipolar transistor when the switching device embodying the invention shifts from on-state to off-state, the storage time due to the stored electric charge can be reduced and high speed switching can be assured.

Thus, it will be appreciated that the switching device of the construction described hereinbefore is improved in its characteristics in comparison with those of the conventional device of bipolar transistor or the like type.

base current waveform in the bipolar transistor stage is illustrated in section (b), and a collector voltage waveform is illustrated in section (c). When comparing the waveforms of FIG. 4 with those of an equivalent bipolar transistor from FIG. 5, the following advantages can be accounted for.

(1) Since current to the base is proportional to the collector on-voltage, spreading time effect of the base current is automatically corrected to cure the base current waveform and voltage immediately after turn-on can be reduced.

(2) Current to the base is reduced to a necessary minimal value and current drawing effect at the time of turn-off becomes large, thus reducing the storage time by the order of one or so.

(3) Because of the small input capacity and reduced Miller effect, the change of turn-on and turn-off can be effected at high speeds.

(4) Since a reduced amount of current to the base is entirely supplied from the collector, driving efficiency of the switching device can be increased.

Figure 6:
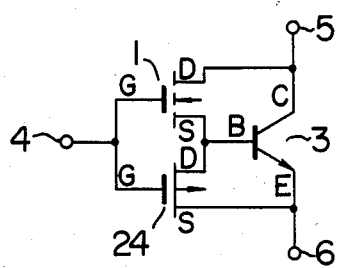
FIG. 6 shows the second embodiment of the present invention.

FIG. 6 shows a second embodiment of the present invention which differs from the FIG. 1 embodiment in that the p-channel JFET 2 is replaced with a p-channel depletion type MOS FET 24. In the depletion type MOS FET, the drain-source is conductive even in the absence of bias voltage applied to the gate. Especially, the p-channel depletion type MOS FET is cut off when the gate potential is positive relative to the source potential. Structurally, a thin p-layer is formed right beneath the gate in which the channel is formed. When no voltage is applied to the gate, the drain-source is coupled by a p-type resistance layer. When the gate is ap-

TABLE 1

| Device | Defects | Effects improved by the switching device embodying the invention and reasons therefore | |
|---|---|---|---|
| bipolar transistor | (1) low $h_{FE}$ | (1) $h_{FE}$ is increased greatly | First stage in the form of small-sized MOS |
| | (2) large $t_{stg}$ | (2) $t_{stg}$ is decreased | Unsaturated output stage and discharge of storage charge |
| Darlington bipolar transistor | (1) large $V_{CE\ sat}$ | (1) $V_{CE\ sat}$ is small (comparable to transistor) | Unsaturated operation of first stage MOS |
| | (2) pool linearity of $h_{FE}/I_C$ | (2) good linearity (comparable to transistor) | Employment of only one stage of bi-polar transistor |
| | (3) medium (insufficient) $t_{stg}$ | (3) $t_{stg}$ is improved | Discharge of storage charge by junction type FET |
| FET/MOS | (1) large on-resistance | (1) on-resistance is small (comparable to transistor) | Output stage transistor |
| | (2) large input capacitance | (2) input capacitance is small (comparable to power MOS of small capacity) | First stage in the form of small-sized MOS |

Figure 3:
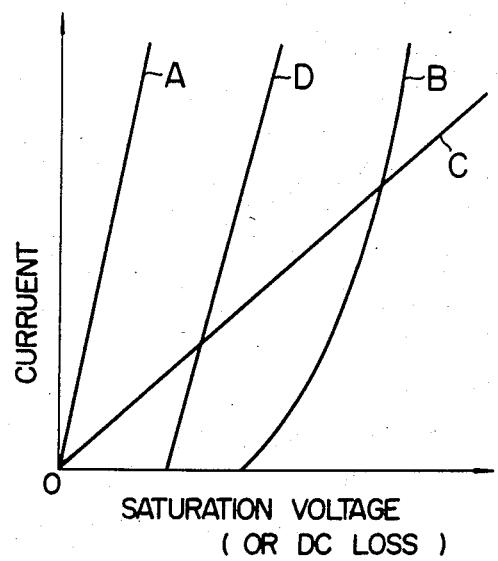
FIG. 3 is a graph showing saturation voltage versus current characteristics in conventional switching devices and in the switching device of FIG. 1.

A saturation voltage versus current characteristic of the switching device embodying the invention in comparison with that of the bipolar transistor, Darlington bipolar transistor, junction type FET or MOS FET is shown in FIG. 3, where a linear characteristic A corresponds to the bipolar transistor, a curved characteristic B to the Darlington bipolar transistor, a linear charactersitic C to the junction type FET and MOS FET, and a linear characteristic D to the switching device of the invention.

Figure 4:
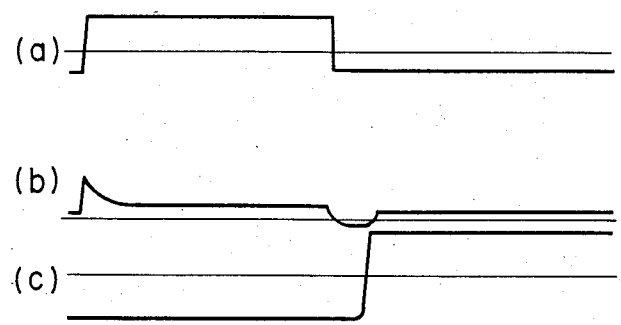
FIG. 4 illustrates in sections (a) through (c) waveforms evidencing effects brought about by the FIG. 1 switching device.
Figure 5:
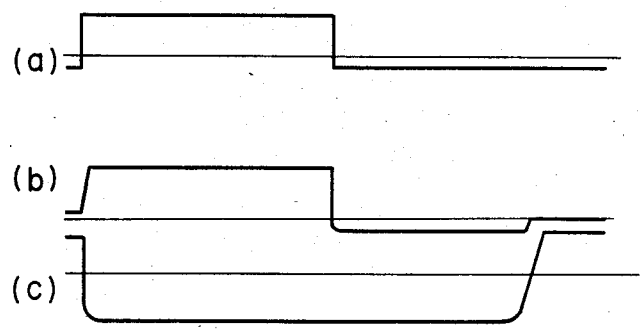
FIG. 5 illustrates in sections (a) through (c) waveforms in a conventional device for comparison with those in FIG. 4.

Among the operation waveforms in the switching device of the invention as shown in FIG. 4, an input drive voltage waveform is illustrated in section (a), a plied with a voltage which is positive relative to the source, holes in the channel are repulsed to retire from the channel layer and conduction in the channel is lost. Accordingly, the operation is the same as that of the JFET described hereinbefore.

Figure 7:
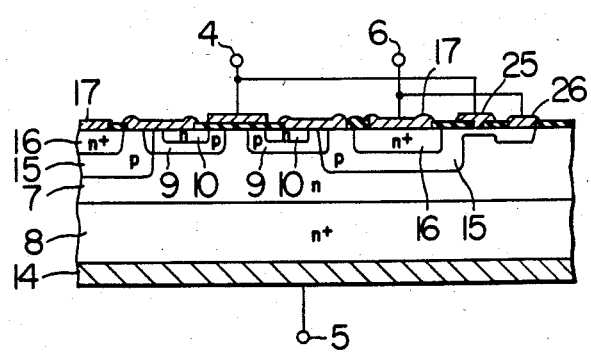
FIG. 7 shows a device structure implementing the second embodiment.

Exemplified in FIG. 7 is a device structure implementing the second embodiment. Differing from FIG. 2, there is formed a p-channel depletion MOS FET which is integral with a base layer 15 of the bipolar transistor and which has a gate electrode 25 above the channel and a source electrode 26 adjoining the gate electrode 25. When the voltage is applied to the gate electrode 4, the gate electrode 25 assumes the same potential and the channel is extinguished owing to the aforementioned effect, thereby turning off the p-channel MOS FET. Upon removal of the gate voltage, the channel becomes conductive and the base-emitter of the bipolar transistor 3 is short-circuited through the channel.

The device structure as shown in FIG. 2 or 7 includes a transistor of a longitudinal n+-p-n-n+ arrangement and hence, it is suitably used as a power switching device which requires a high collector-base withstand voltage and consumes a large amount of emitter current. However, in order to construct a high speed logic circuit, a plurality of the arrangements as shown in FIGS. 1 or 6 are required to be combined, and it is undesirable to connect the collector layers in common.

Figure 8:
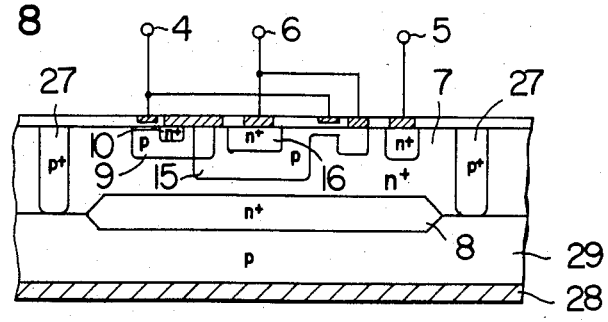
FIG. 8 shows a structure of the bipolar transistor and the complementary switching device acting as independent components of a logic circuit.

FIG. 8 illustrates a structure of the bipolar transistor and the complementary MOS switching device acting as independent components of a logic circuit. The operation of this arrangement is similar to that of the FIG. 7 arrangement. Structurally, adjacent components are isolated from each other by a p+-type layer 27 to meet the aforementioned object. A collector electrode of the bipolar transistor is coupled to an n-type layer through an n+-type layer 28. An n+-type layer 8 is formed on a p-type substrate 29. An epitaxially grown n-type layer is formed on the layer 8 so that this layer 8 is sandwiched by the substrate 29 and the n-type layer. The n+-type layer 8 is effective to increase the lateral conductivity of collector current. The deep formation of the n+-type layer 28 so as to connect it to the n+-type layer 8 permits flow of a large current.

Figure 9:
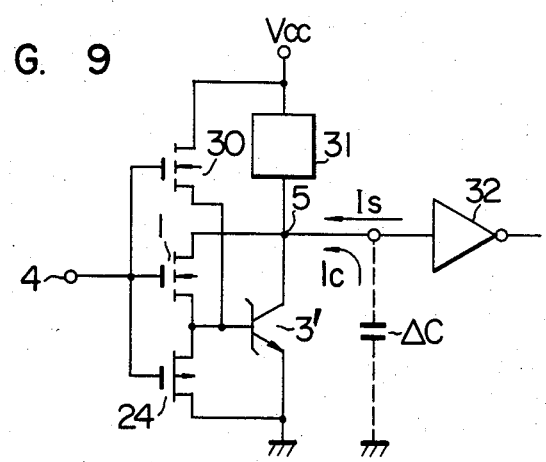
FIG. 9 shows another embodiment of the present invention.

The switching device of this invention is applied to a logic circuit as shown in FIG. 9. In the embodiment of FIG. 9, the same elements as those of the FIG. 6 circuit are designated by the same reference characters. The FIG. 9 circuit differs from the FIG. 6 circuit in that the NPN transistor 3 is replaced with a so-called Schottky clamp type transistor 3' comprised of a metal-semiconductor diode for switching, that an N-channel enhancement type MOS transistor 30 is additionally inserted between a power source Vcc and a base of the transistor 3', and that a pull-up circuit (simply realized by a resistor) 31 for providing a high logic level is provided. Gates of the FETs are connected in common to an input terminal 4.

In operation, when a positive high level signal is applied to the input terminal 4, a transistor 24 is turned off, transistors 1 and 30 are turned on and consequently, the transistor 3' is turned on. If the transistor 3' is loaded with a TTL circuit 32 and a capacitive load ΔC, a large base current is passed through the transistor 1 when a large transient charging current Ic flows to rapidly turn on the transistor 3', and the transistor 30 feeds the base current when a steady input current Is flows into the TTL circuit to ensure that the transistor 3' is maintained by the Schottky clamp therefor at a shallow saturation level corresponding to a low logic level. Next, when the input terminal 4 is rendered low level, the transistors 1 and 30 are turned off and the transistor 24 is turned on thereby to turn off the transistor 3', thus producing the high level output.

The transistor 1, which is maintained at a shallow saturation state because of the load current sink under the steady state of the transistor 3', can be of a small-sized structure.

It will be appreciated from the above description that the switching device illustrated in FIG. 9 can make use of a decreased number of coupling stages and shared operations of functional transistors to provide a highly desirable high speed and low power consumption logic circuit.

Because of one feature of the low input capacity characteristic, the exemplified switching device can reduce input drive power considerably at the time of high frequency driving, thus ensuring direct drive by a CMOS (complementary MOS) logical circuit. This accounts for the fact that the switching device of the invention can suitably be applied to high frequency switching stabilizing power sources, making it possible to reduce cost of power source circuits and improve reliability thereof.

Figure 10:
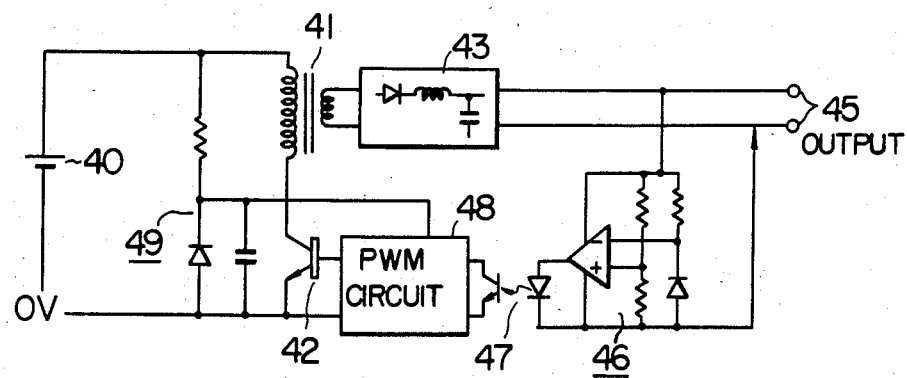
FIG. 10 is a circuit diagram of one embodiment of a circuit utilizing the switching device according to the invention.

Exemplarily illustrated in FIG. 10 is a high frequency switching DC stabilizing power source of input/output insulating type using the switching device embodying the invention. Connected across a DC input power source 40 as obtained by rectifying and smoothing AC 100 V is a series connection of a primary winding of a high frequency transformer 41 and a switching device 42. A secondary winding of the transformer 41 is connected to an output terminal 45 via a rectifying and smoothing circuit 43 comprised of a rectifying diode, an air-core reactor and a film capacitor. The output terminal 45 is also connected to an input diode of a semiconductor photo-coupler 47 via an error amplifier circuit 46 comprised of an output voltage detector bridge and a differential amplifier. The output of the photo-coupler is connected to a PWM (pulse width modulation) circuit 48 comprised of a CMOS timer, the output of which is connected to a gate electrode of the switching device 42. The PWM circuit 48 has a power source terminal connected to an auxiliary power source circuit 49 of a voltage divider circuit comprised of a resistor, a Zener diode and a capacitor and fed from the power source 40.

The PWM circuit 48 of CMOS is operated, for example, in an astable multivibrator mode. The output pulse width of the PWM circuit 48 is set such that the power source feeds an allowable maximum output when the output from the photo-coupler is zero. In other words, the polarity of the pulse width is such that the pulse width is decreased in inverse proportion to the output of the photo-coupler.

In operation, when voltage of the input power source 40 is applied to the power source circuit, voltage of the PWM circuit 48 is established through the auxiliary power source 49 and the PWM circuit 48 switches the switching device 42 by the output of allowable maximum pulse width. Consequently, output voltage at the output terminal 45 rises abruptly from zero and when reaching a prescribed value at which bridge output of the error amplifier circuit 46 becomes substantially zero, the output voltage is stabilized.

With the above construction, the insulating power source can take advantage of direct drive by the CMOS logical circuit with a small driving capacity, thus attaining the following advantages:
(1) Simplified circuit and low manufacturing cost.
(2) Easy high frequency operation and reduced size.
(3) Steady start and control of high-speed response.
(4) Minimized area of insulating part and easy attainment of withstand-voltage and surge-resistant capability.

As has been described, the present invention provides a high-speed and large-capacity switching device having a high input impedance comprised of an input capacitance and being capable of reducing the switch-on resistance and delay in switching-off due to emitter-base storage charge inherent in bipolar transistors.

It has already been known to short-circuit the emitter-base by another bipolar transistor or another enhancement type MOS FET. The known expedient requires saturation at a voltage drop which is sufficiently smaller than the base-emitter voltage to be short-circuited and prevents high speed switching due to the fact that the bipolar transistor feeds a larger base current. Also, since in the enhancement type MOS FET the gate voltage is required to be decreased below a threshold, it is necessary to drive the enhancement type MOS FET to a level which is below the emitter potential of the bipolar transistor. Therefore, the enhancement type MOS FET is unsuitable for the logic circuit which operates with the emitter potential that is common grounded. Conversely, when the enhancement type MOS FET is cut off, the source drain voltage is clamped by the base-emitter forward voltage drop and the gate of the switching device and the gate of the enhancement type MOS FET are driven in common, with the result that the gate potential becomes higher than the source potential (in the case of p-channel), thereby causing damage of the gate oxide film. On the contrary, in the present invention based on the depletion type device, it is possible to realize a sufficient cut-off state by a large gate voltage amplitude in the presence of the short-circuiting by a relatively large current, thereby eliminating all the problems as described above.

What is claimed is:

1. A switching device comprising a MOS FET, a depletion type FET and a bipolar transistor, a source of the MOS FET being connected to a drain of the depletion type FET with the connecting junction connected to a base of the bipolar transistor, a drain of the MOS FET being connected to a collector of the bipolar transistor and a source of the depletion type FET being connected to an emitter of the bipolar transistor, the collector-emitter conduction or non-conduction of said bipolar transistor being controlled by an input signal applied to gates of the MOS FET and depletion type FET connected in common.

2. A switching device according to claim 1, wherein the MOS FET and depletion type FET have channel charge carrier types which are different from each other.

3. A switching device according to claim 1, wherein a collector region of the bipolar transistor and a drain region of an enhancement type MOS FET are formed in common, and the depletion type FET in the form of a junction type FET which is insulated by an isolation region is formed in the common region.

4. A switching device according to claim 1, wherein a collector region of the bipolar transistor and a drain region of and enhancement type MOS FET are formed in common, and the depletion type FET is formed which has a channel adjacent to a base formed in the common region and whose source is connected to and emitter.

5. A switching device according to claim 1, wherein a metal-semiconductor diode is connected across the base-collector junction of said bipolar transistor, said diode having the same current-conducting direction as that of the base-collector junction.

6. A circuit incorporating the switching device according to claim 1, wherein a source of an enhancement type FET having the same polarity as that of an enhancement type MOS FET connected across the collector-base of a bipolar transistor is connected to a base electrode of the bipolar transistor, gates of the enhancement type MOS FET and the enhancement type FET are connected in common, and a drain of the enhancement type FET is connected to a bias supply source.

7. A circuit incorporating the switching device according to claim 1, wherein said circuit is directly driven by a pulse width modulation (PWM) circuit comprising a CMOS timer.

8. A switching device according to claim 1, wherein the gate of the MOS FET and the depletion type FET are directly coupled in short-circuit relationship with one another.

* * * * *